(12) United States Patent  
Edwards et al.

(10) Patent No.: US 11,552,183 B2  
(45) Date of Patent: Jan. 10, 2023

(54) TRANSISTORS WITH OXIDE LINER IN DRIFT REGION

(71) Applicant: Texas Instruments Incorporated, Dallas, TX (US)

(72) Inventors: Henry Litzmann Edwards, Garland, TX (US); Andrew D. Strachan, Santa Clara, CA (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 16/897,382

(22) Filed: Jun. 10, 2020

(65) Prior Publication Data

US 2020/0303518 A1 Sep. 24, 2020

Related U.S. Application Data

(62) Division of application No. 15/813,934, filed on Nov. 15, 2017, now Pat. No. 10,714,594.

(51) Int. Cl.

| | |
|---|---|
| *H01L 29/66* | (2006.01) |
| *H01L 29/78* | (2006.01) |
| *H01L 29/06* | (2006.01) |
| *H01L 21/762* | (2006.01) |
| *H01L 29/10* | (2006.01) |

(Continued)

(52) U.S. Cl.  
CPC ...... *H01L 29/66681* (2013.01); *H01L 21/266* (2013.01); *H01L 21/76205* (2013.01); *H01L 29/063* (2013.01); *H01L 29/0634* (2013.01); *H01L 29/0653* (2013.01); *H01L 29/402* (2013.01); *H01L 29/66659* (2013.01); *H01L 29/7823* (2013.01); *H01L 29/7835* (2013.01); H01L 21/76224 (2013.01); H01L 29/1045 (2013.01)

(58) Field of Classification Search  
CPC ............ H01L 21/266; H01L 21/76205; H01L 21/76224; H01L 29/063; H01L 29/402; H01L 29/0653; H01L 29/1045; H01L 29/66681; H01L 29/7823; H01L 29/66659; H01L 29/0634; H01L 29/7835  
See application file for complete search history.

(56) References Cited

U.S. PATENT DOCUMENTS

| | | |
|---|---|---|
| 5,891,787 A | 4/1999 | Gardner et al. |
| 6,177,333 B1 | 1/2001 | Rhodes |
| 6,426,258 B1 | 7/2002 | Harada et al. |

(Continued)

*Primary Examiner* — Galina G Yushina  
(74) *Attorney, Agent, or Firm* — Jacqueline J. Garner; Frank D. Cimino (57) ABSTRACT

A method to fabricate a transistor includes implanting dopants into a semiconductor to form a drift layer having majority carriers of a first type; etching a trench into the semiconductor; thermally growing an oxide liner into and on the trench and the drift layer; depositing an oxide onto the oxide liner on the trench to form a shallow trench isolation region; implanting dopants into the semiconductor to form a drain region in contact with the drift layer and having majority carriers of the first type; implanting dopants into the semiconductor to form a body region having majority carriers of a second type; forming a gate oxide over a portion of the drift layer and the body region; forming a gate over the gate oxide; and implanting dopants into the body region to form a source region having majority carriers of the first type.

11 Claims, 5 Drawing Sheets

(51) Int. Cl.
    *H01L 21/266*     (2006.01)
    *H01L 29/40*     (2006.01)

(56) References Cited

U.S. PATENT DOCUMENTS

| | | | |
|---|---|---|---|
| 6,531,355 | B2 | 3/2003 | Mosher et al. |
| 7,101,764 | B2 | 9/2006 | Petti |
| 9,171,916 | B1 * | 10/2015 | Snyder .............. H01L 29/66659 |
| 9,484,454 | B2 | 11/2016 | Levy et al. |
| 2008/0093641 | A1 | 4/2008 | Ludikhuize et al. |
| 2008/0315267 | A1 | 12/2008 | Hampp et al. |
| 2009/0302385 | A1 * | 12/2009 | Chu .................. H01L 29/66659 |
| | | | 257/343 |
| 2012/0037988 | A1 * | 2/2012 | Hao .................... H01L 29/0634 |
| | | | 257/343 |
| 2013/0270635 | A1 | 10/2013 | Parris et al. |
| 2013/0341717 | A1 * | 12/2013 | Chen ................ H01L 29/66659 |
| | | | 257/337 |
| 2015/0041894 | A1 * | 2/2015 | Hebert ............... H01L 29/0634 |
| | | | 257/339 |
| 2015/0179792 | A1 * | 6/2015 | Sridhar ............. H01L 29/66659 |
| | | | 257/336 |
| 2015/0340428 | A1 * | 11/2015 | Lu ....................... H01L 29/0623 |
| | | | 438/286 |
| 2016/0225812 | A1 | 8/2016 | Elkhatib et al. |
| 2017/0170312 | A1 | 6/2017 | Yoo et al. |
| 2017/0194490 | A1 * | 7/2017 | Li ....................... H01L 29/0692 |

\* cited by examiner

TRANSISTORS WITH OXIDE LINER IN DRIFT REGION

CROSS REFERENCE TO RELATED APPLICATIONS

This application is a divisional of U.S. Nonprovisional patent application Ser. No. 15/813,934, filed Nov. 15, 2017, the contents of which is herein incorporated by reference in its entirety.

BACKGROUND

LDMOS (Laterally Diffused MOSFET) devices find wide applications in high power or high voltage circuits, such as for example switching DC-to-DC voltage converters. A STI (Shallow Trench Isolation) region is usually formed in the drift layer of an LDMOS. For good performance, it is important that an LDMOS not exhibit hot carrier shifts, where for example electrons in an n-channel LDMOS are injected into the STI region. Furthermore, in many applications, it is desirable for an LDMOS to operate in high voltage environments, and yet still have relatively low ON resistance.

SUMMARY

In accordance with at least one embodiment of the invention, a method to fabricate a transistor comprises: implanting dopants into a semiconductor to form a drift layer having majority carriers of a first type; etching a trench into the semiconductor; thermally growing an oxide liner into and on the trench and the drift layer; depositing an oxide onto the oxide liner on the trench to form a shallow trench isolation region; implanting dopants into the semiconductor to form a drain region in contact with the drift layer and having majority carriers of the first type; implanting dopants into the semiconductor to form a body region having majority carriers of a second type; forming a gate oxide over a portion of the drift layer and the body region; forming a gate over the gate oxide; and implanting dopants into the body region to form a source region having majority carriers of the first type.

In accordance with at least one embodiment of the invention, the method further comprises implanting dopants into the drift layer to form a region having majority carriers of the second type.

In accordance with at least one embodiment of the invention, the step of implanting dopants into the drift layer to form the region is performed after the step of thermally growing the oxide liner.

In accordance with at least one embodiment of the invention, the step of implanting dopants into the drift layer to form the region is performed after the step of forming the gate over the gate oxide.

In accordance with at least one embodiment of the invention, the step of implanting dopants into the drift layer to form the region comprises implanting indium at a dose of $2 \cdot 10^{12}$ cm$^{-2}$ to $1 \cdot 10^{13}$ cm$^{-2}$ with an energy from 50 KeV to 500 KeV.

In accordance with at least one embodiment of the invention, the region can be noncontiguous.

In accordance with at least one embodiment of the invention, the step of implanting dopants into the semiconductor to form the drift layer comprises implanting dopants through an opening in a mask.

In accordance with at least one embodiment of the invention, the method further comprises implanting dopants through the opening in the mask into the semiconductor to form a region having majority carriers of the second type.

In accordance with at least one embodiment of the invention, the step of implanting dopants through the opening in the mask into the semiconductor to form the region comprises doping with indium.

In accordance with at least one embodiment of the invention, the step of implanting dopants through the opening in the mask into the semiconductor to form the region is performed before the step of thermally growing the oxide liner.

In accordance with at least one embodiment of the invention, the region is shallower than the drift layer relative to the oxide liner.

In accordance with at least one embodiment of the invention, the method further comprises implanting dopants through the opening in the mask into the semiconductor to form a second region having majority carriers of the first type.

In accordance with at least one embodiment of the invention, the step of implanting dopants through the opening in the mask into the semiconductor to form the second region includes implanting dopants at an angle so that the second region reaches laterally beyond the region.

In accordance with at least one embodiment of the invention, the method further comprises implanting dopants into the body region to form a body contact having majority carriers of the second type.

In accordance with at least one embodiment of the invention, the majority carriers of the first type are electrons and the majority carriers of the second type are holes.

In accordance with at least one embodiment of the invention, a second method to fabricate a transistor comprises: forming a mask over a semiconductor; etching an opening in the mask to expose a portion of the semiconductor; implanting dopants through the opening into the semiconductor to form a drift layer having majority carriers of a first type; etching a trench into the semiconductor; oxidizing the trench; oxidizing the exposed portion of the semiconductor while performing the step of oxidizing the trench; implanting dopants into the semiconductor to form a drain region in contact with the drift layer and having majority carriers of the first type; implanting dopants into the semiconductor to form a body region having majority carriers of a second type; implanting dopants into the semiconductor to form a source region in contact with the body region and having majority carriers of the first type; and forming a gate over the drift layer and the body region.

In accordance with at least one embodiment of the invention, the second method further comprises implanting dopants through the opening into the semiconductor to form a region having majority carriers of the first type.

In accordance with at least one embodiment of the invention, in the second method, the step of forming the mask over the semiconductor comprises: forming an oxide layer over the semiconductor; and forming a nitride layer over the oxide layer.

In accordance with at least one embodiment of the invention, in the second method, the majority carriers of the first type are electrons and the majority carriers of the second type are holes.

In accordance with at least one embodiment of the invention, a transistor comprises: a semiconductor; a drift layer formed in the semiconductor and having majority carriers of a first type; a drain region formed in the semiconductor in contact with the drift layer and having majority carriers of the first type; a body region formed in the semiconductor and having majority carriers of a second type; a source region formed in the semiconductor in contact with the body region and having majority carriers of the first type; a gate formed over the semiconductor to control current through the body region from the source region to the drain region; a region formed in the semiconductor in contact with the drift layer and having majority carriers of the second type; and an oxide layer grown into the semiconductor and in contact with the region.

BRIEF DESCRIPTION OF THE DRAWINGS

For a detailed description of various examples, reference will now be made to the accompanying drawings in which.

DETAILED DESCRIPTION

Conventional LDMOS devices usually have an STI region in the drift layer, which can become damaged as channel current bunches near an STI corner. By utilizing a thin oxide liner thermally grown in the drift region of an LDMOS according to embodiments, current flow in the device channel does not encounter the same sharp corners as for a conventional STI region. This is expected to help improve performance and to mitigate hot carrier effects. Furthermore, adding a shallow resurf region to the drift layer allows higher depletion under reverse voltage bias, thereby allowing higher doping in the drift region to reduce ON resistance.

In accordance with the disclosed embodiments, a transistor (e.g., an LDMOS) comprises an oxide liner in the drift layer. In accordance with further disclosed embodiments, an LDMOS comprises a resurf region in the drift layer next to the oxide liner. In accordance with the disclosed embodiments, a process to fabricate an LDMOS comprises thermally growing an oxide liner over the drift region while also growing an oxide liner over surfaces of a trench as part of an STI region. In accordance with further disclosed embodiments, a process to fabricate an LDMOS transistor comprises implanting dopants to form a resurf region in the drift region, and thermally growing an oxide liner over the drift region while also growing an oxide liner over surfaces of a trench as part of an STI region.

Figure 1A:
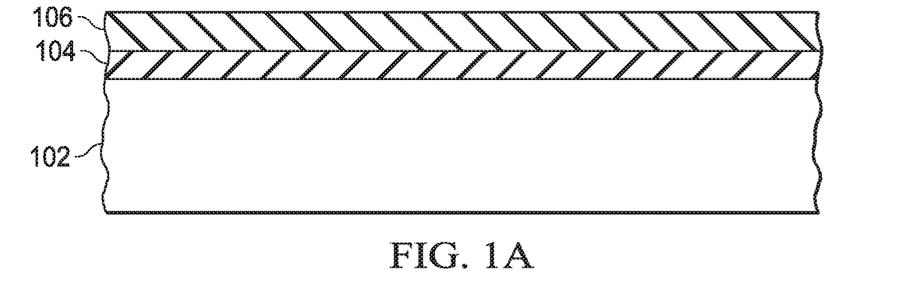
FIG. 1A shows an illustrative LDMOS at an initial stage of fabrication in accordance with various examples.

FIG. 1A shows an LDMOS at an initial stage of fabrication according to an illustrative embodiment. Formed on a semiconductor 102 are an oxide layer 104 and a nitride layer 106. The semiconductor 102 may be fabricated from a silicon crystal, initially doped as a p-type semiconductor. The oxide layer 104 may be referred to as a pad oxide or as a sacrificial oxide layer.

Figure 1B:
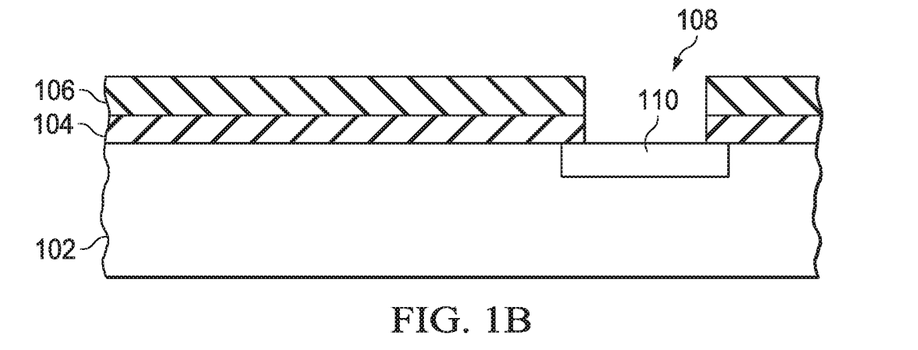
FIG. 1B shows an illustrative LDMOS at an initial stage of fabrication in accordance with various examples.

FIG. 1B shows an LDMOS at a stage of fabrication according to an illustrative embodiment. An opening 108 is etched into the oxide layer 104 and the nitride layer 106 to expose a portion of the surface of the semiconductor 102. A photoresist (not shown) formed over the nitride layer 106 is exposed to define the opening 108, followed by etching away the exposed part of the photoresist. Dopants are implanted through the opening 108 and into the semiconductor 102 to form a drift layer 110. In the example of FIG. 1B, donor dopants are implanted into the semiconductor 102 so that the drift layer 110 is an n-type semiconductor. For example, arsenic may be implanted at a dose of $2 \cdot 10^{12}$ cm$^{-2}$ to $1 \cdot 10^{12}$ cm$^{-2}$ with energy from 20 KeV to 200 KeV. As another example, phosphorous may be implanted at a dose of $2 \cdot 10^{12}$ cm$^{-2}$ to $1 \cdot 10^{13}$ cm$^{-2}$ with energy from 5 KeV to 500 KeV.

Figure 2A:
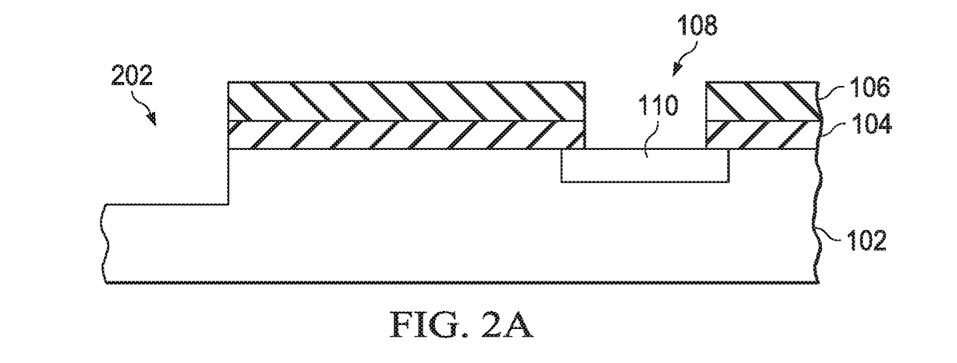
FIG. 2A shows an illustrative LDMOS at an initial stage of fabrication in accordance with various examples.

FIG. 2A shows an LDMOS at a stage of fabrication according to an illustrative embodiment. An opening 202 is formed in the oxide layer 104 and the nitride layer 106, and the semiconductor 102 is etched through the opening 202 to form a trench. The trench may be etched into the semiconductor 102 before etching the opening 108 and implanting dopants to form the drift layer 110. For ease of illustration only a portion of the trench is shown, that is, only one sidewall is explicitly shown. The trench formed in the embodiment of FIG. 2A will become an STI region to isolate the LDMOS from other devices formed on the semiconductor 102.

Figure 2B:
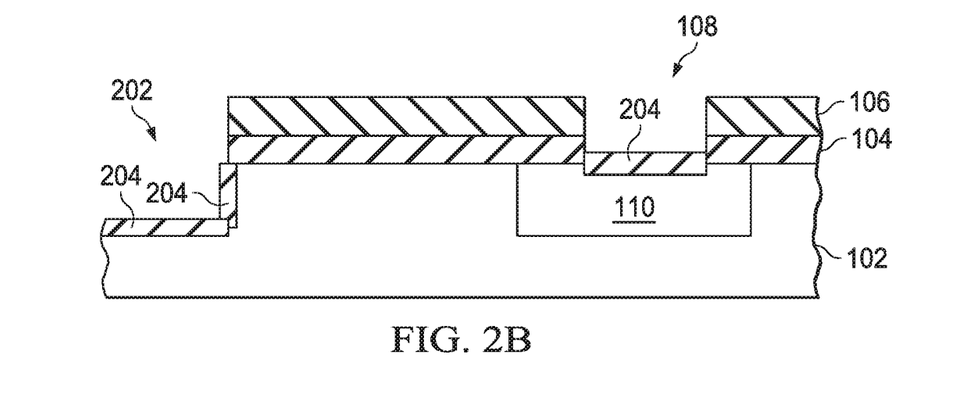
FIG. 2B shows an illustrative LDMOS at an initial stage of fabrication in accordance with various examples.

FIG. 2B shows an LDMOS at a stage of fabrication according to an illustrative embodiment. The portions of the surface of the semiconductor 102 that are exposed through the openings 108 and 202 are oxidized so that an oxide liner 204 is thermally grown over the trench defined by the opening 202 and over the portion of the semiconductor 102 exposed by the opening 108. As a particular example, the oxide liner 204 may be grown at a relatively high temperature (approximately 1100° C.) resulting in a thin oxide layer of about 10 nm to 20 nm.

After implanting dopants to form the drift layer 110, a dopant activation rapid thermal step, or anneal, may be employed to remove implantation related damage. The thermal oxidation and the anneal step drive the drift layer 110, spreading the drift layer 110 which may be advantageous for high voltage operation. Accordingly, FIG. 2B shows the drift layer 110 larger than its representation in FIG. 2A to indicate its increase in size due to the thermal oxidation represented by the embodiment of FIG. 2B.

The combination of the oxide layer 104 and the nitride layer 106 serves as a mask, so that dopant implanting and thermal oxidation may be performed on selected areas of the semiconductor 102. The same part of the mask defined by the oxide layer 104 and the nitride layer 106 that is used to define the drift layer 110 is also used to define that part of the oxide liner 204 in contact with the drift layer 110. Furthermore, the same mask, i.e., the combination of the oxide layer 104 and the nitride layer 106, is used to form that portion of the oxide liner 204 in contact with the drift layer 110 and that part of the oxide liner 204 that lines the trench defined by the opening 202. Accordingly, if the fabrication process of the LDMOS is to include an STI region, then an additional processing step and mask are not needed to form the oxide liner 204 in contact with the drift region 110 because this can be done when thermally growing the oxide liner 204 for the STI region.

Figure 3A:
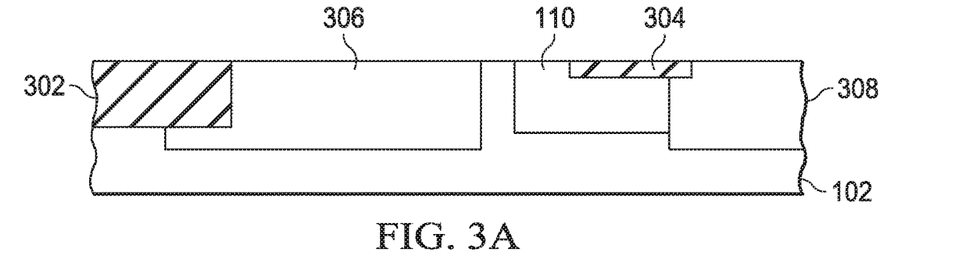
FIG. 3A shows an illustrative LDMOS at an initial stage of fabrication in accordance with various examples.

FIG. 3A shows an LDMOS at a stage of fabrication according to an illustrative embodiment. Silicon dioxide ($SiO_2$) is deposited over the semiconductor 102 to fill in the trench, for example by CVD (Chemical Vapor Deposition). The oxide layer 104 and the nitride layer 106 have been stripped off, and CMP (Chemical Mechanical Polishing) is performed to smooth the surface of the semiconductor 102. The filled-in trench is now an STI region 302. The portion of the oxide liner 204 in contact with the drift layer 110 is labeled 304 in FIG. 3A. Dopants are implanted into the semiconductor 102 to form a body region 306, and dopants are implanted into the semiconductor 102 to form a drain region 308. For ease of illustration, FIG. 3A does not show a photoresist mask used to define openings for the body region 306 and the drain region 308. In the particular example of FIG. 3A, the body region 306 is doped to be a p-type semiconductor, and the drain region 308 is doped to be an n-type semiconductor. The drain region 308 is in contact with the drift layer 110.

Figure 3B:
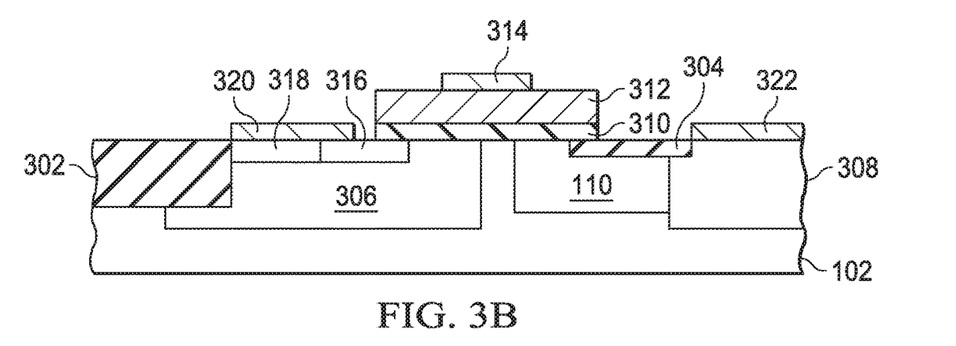
FIG. 3B shows an illustrative LDMOS at a stage of fabrication according to an illustrative embodiment.

FIG. 3B shows an LDMOS at a stage of fabrication according to an illustrative embodiment. A gate oxide 310, a gate 312, and a contact 314 to the gate 312 are formed over the semiconductor 102. The gate 312 may comprise polysilicon. Dopants are implanted into the body region 306 to form a source region 316, and dopants are implanted into the body region 306 to form a body contact 318.

In the particular embodiment of FIG. 3B, the source region 316 is doped to be an n-type semiconductor, and the body contact 318 is doped to be a p-type semiconductor, where the body contact 318 is highly doped to provide an ohmic contact to the body region 306. More generally, the majority carriers for the source region 316 are of the same type as the majority carriers for the drain region 308, and the majority carriers for the body contact 318 are of the same type as the majority carriers for the body region 306. A contact 320 is formed on the source region 316 and the body contact 318. A contact 322 is formed on the drain region 308.

In a working device, additional vias and interconnects are made to the various contacts in FIG. 3B so as to provide electrical connection to other devices (not shown) to realize a circuit. For ease of illustration, such components fabricated in a BEOL (Back End Of Line) process are not shown in FIG. 3B.

With the oxide liner 304 thermally grown in the drift region 110, current flow in the device channel does not encounter the same sharp corners as for a conventional STI region in the drift region 110, thereby reducing hot carrier effects.

Figure 4:
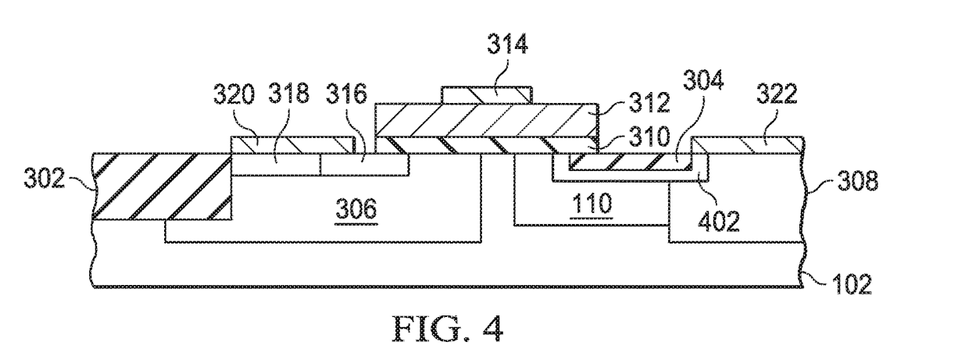
FIG. 4 shows an illustrative LDMOS at an initial stage of fabrication in accordance with various examples.

FIG. 4 shows an LDMOS at a stage of fabrication according to an illustrative embodiment. The embodiment of FIG. 4 differs from that of FIG. 3B by including a resurf (reduced surface field) region 402 in contact with the drift layer 110 and below and in contact with the oxide liner 304. The resurf region 402 is doped to have majority carriers that are of complementary type to the majority carriers of the drift layer 110. For example, for the particular embodiment of FIG. 4, the drift layer 110 is an n-type semiconductor and the region 402 is a p-type semiconductor.

Dopants are implanted into the semiconductor 102 to form the resurf region 402. For example, in an embodiment indium is implanted into the semiconductor 102 at a dose of $2 \cdot 10^{12}$ cm$^{-2}$ to $1 \cdot 10^{13}$ cm$^{-2}$ with energy from 50 KeV to 500 KeV. In some embodiments, the dopants may be implanted after forming the gate 312, and may be implanted through the oxide liner 304.

The resurf region 402 helps deplete the drift layer 110. This allows higher doping of the drift layer 110 for a given breakdown voltage compared to a drift layer with less depletion under reverse voltage bias, thereby contributing to a lower ON resistance. The presence of the resurf region 402 helps to force current flow away from the Si-to-SiO$_2$ interface associated with the oxide liner 304, thereby further suppressing hot carrier affects.

Figure 5:
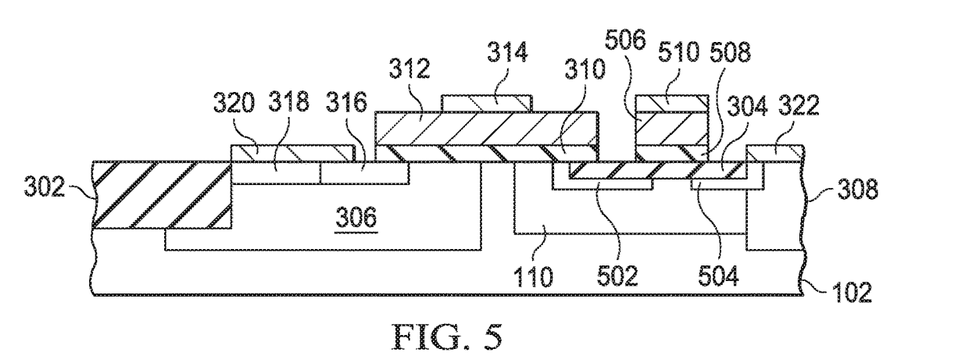
FIG. 5 shows an illustrative LDMOS transistor at an initial stage of fabrication in accordance with various examples.

FIG. 5 shows an LDMOS at a stage of fabrication according to an illustrative embodiment. The embodiment of FIG. 5 has a noncontiguous resurf region, labeled and referred to as resurf region 502 and resurf region 504. A gate 506 is formed on a gate oxide 508, where the combination of the gate 506 and the gate oxide 508 serves as a mask to donor implantation when forming the resurf region 502 and the resurf region 504.

A noncontiguous resurf region may be of use in those situations where the doping of a single, contiguous resurf region is too heavy to fully deplete the drift layer 110 when under reverse voltage bias. Furthermore, the gate 506 may be used to modulate the carrier concentration of the drift layer 110 for a lower ON resistance and to induce a SCR (Silicon Control Rectifier) effect for faster switching. A contact 510 is formed on the gate 506 to provide an electrical connection to other metal layers (not shown).

Figure 6A:
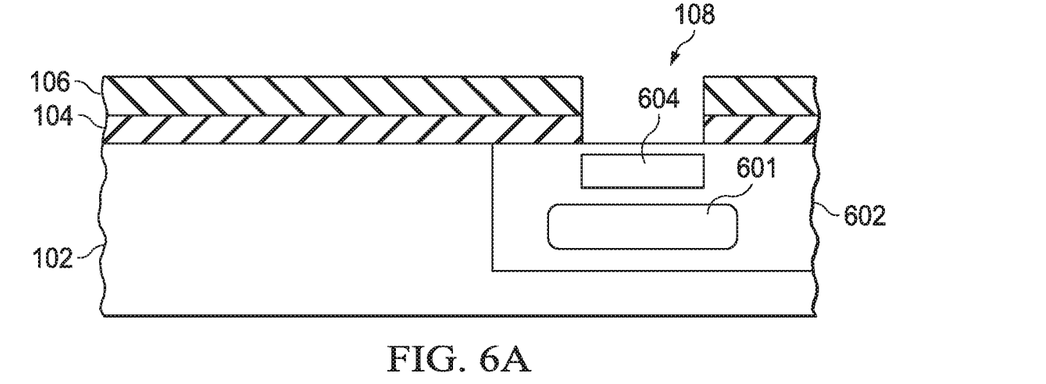
FIG. 6A shows an illustrative LDMOS at an initial stage of fabrication in accordance with various examples.

FIG. 6A shows an LDMOS at a stage of fabrication according to an illustrative embodiment. Dopants are implanted through the opening 108 and into the semiconductor 102 to form a region 601. In the particular embodiment of FIG. 6A, relatively high-energy phosphorus dopants are implanted into the semiconductor 102 to form the region 601, with energy in the MeV range. FIG. 6A illustrates a straggle region 602 due to the dopant scattering. The combination of the region 601 and the straggle region 602 form a drift layer, and may be referred to as such.

There may be straggle regions in the embodiments described above, although such regions are not shown for ease of illustration. Accordingly, the region 601 in FIG. 6A may also be referred to as a drift layer, although it is convenient to explicitly illustrate the regions 601 and 602 for the drift layer rather than to illustrate the drift layer using a single region.

Dopants are implanted through the opening 108 and into the semiconductor 102 to form a resurf region 604, where the doping is complementary in type to the doping for the drift layer (regions 601 and 602). In the particular embodiment of FIG. 6A, the drift layer is an n-type semiconductor and the resurf region 604 is a p-type semiconductor. The energy of the dopants used to form the drift layer is such that the resulting doping profile is retrograde, where the doping concentration is heavier at larger depths of the drift layer relative to the surface of the semiconductor 102. This retrograde profile helps restrict the resurf region 604 from extending too deeply, thereby providing a relatively shallow depth for the resurf region 604 to help reduce degradation and ON resistance.

The combination of the oxide layer 104 and the nitride layer 106 serves as a mask for both the implantation of dopants to form the drift layer (regions 601 and 602) and the implantation of dopants to form the resurf region 604. The drift layer and the resurf region 604 are formed before growing an oxide liner and before forming a gate.

Figure 6B:
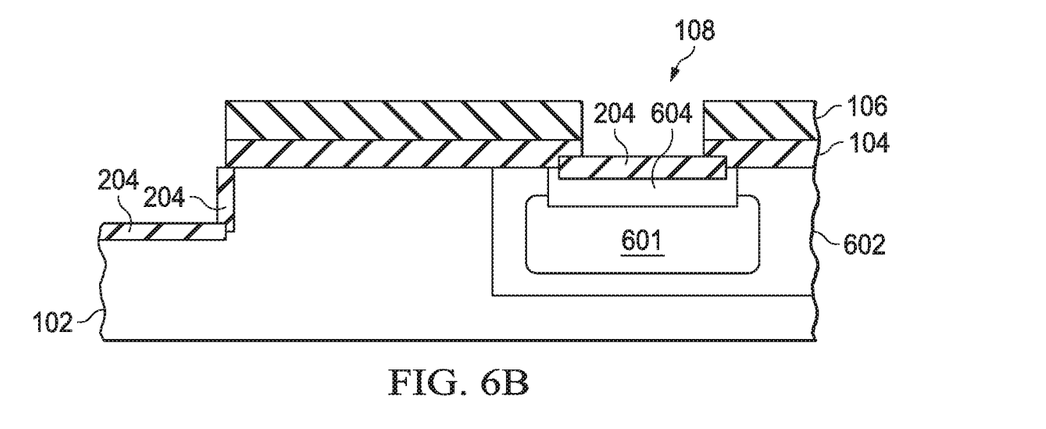
FIG. 6B shows an illustrative LDMOS at an initial stage of fabrication in accordance with various examples.

FIG. 6B shows an LDMOS at a stage of fabrication according to an illustrative embodiment. An oxide layer 204 is thermally grown on those portions of the surface of the semiconductor 102 exposed by the mask comprising the oxide layer 104 and the nitride layer 106. FIG. 6B shows that the region 601 has diffused to a larger size compared to that of FIG. 6A, and the resurf region 604 has diffused so that it is in contact with the region 601 and in contact with the portion of the oxide liner 204 above the drift layer.

Figure 7:
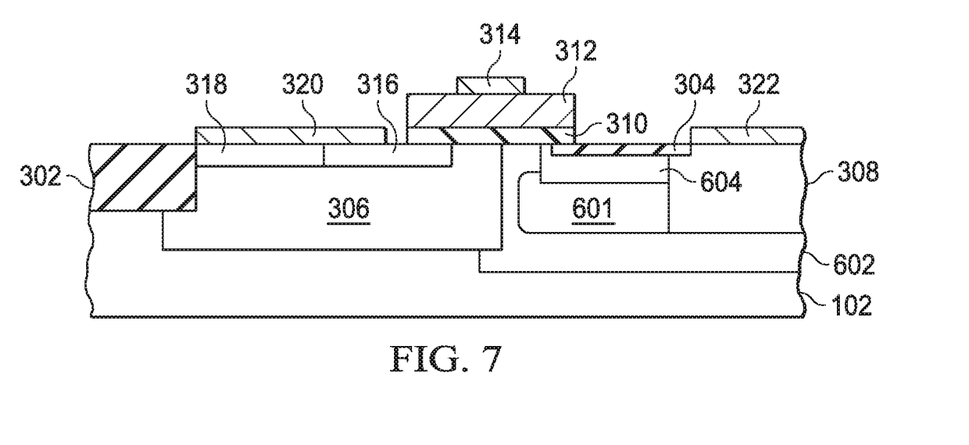
FIG. 7 shows an illustrative LDMOS at an initial stage of fabrication in accordance with various examples.

FIG. 7 shows an LDMOS at a stage of fabrication according to an illustrative embodiment. Additional processing steps applied to the embodiment of FIG. 6B result in the embodiment of FIG. 7. Silicon dioxide ($SiO_2$) is deposited on the semiconductor 102, and the oxide layer 104 and the nitride layer 106 are stripped, followed by CMP. The drain region 308 is formed in the semiconductor 102 to contact the drift layer and the resurf region 604. The body region 306 is formed, and a gate 312 is formed over the gate oxide 310. The source region 316 and the body contact 318 are formed in the body region 306. The contact 314 is deposited on the gate 312, the contact 320 is deposited on the source region 316 and the body contact 318, and the contact 322 is deposited on the drain region 308.

Figure 8A:
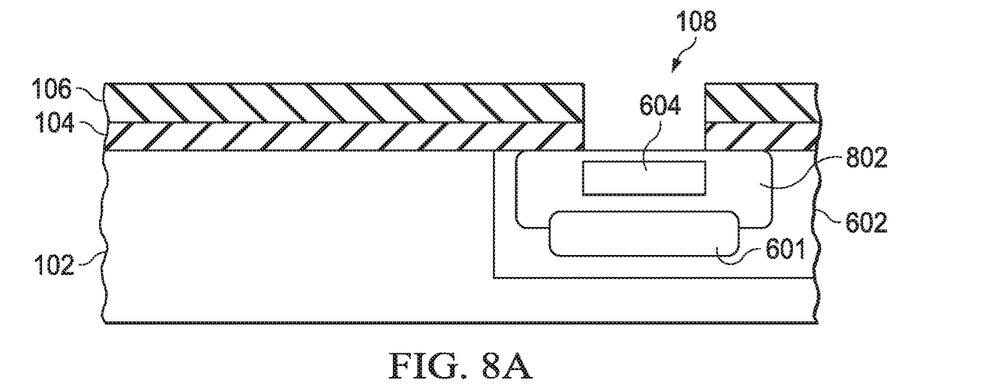
FIG. 8A shows an illustrative LDMOS at an initial stage of fabrication in accordance with various examples.

FIG. 8A shows an LDMOS at a stage of fabrication according to an illustrative embodiment. Dopants are implanted through the opening 108 in the mask (comprising the combination of the oxide layer 104 and the nitride layer 106) to form the regions 601 and 602, and dopants are implanted through the opening 108 to form the resurf region 604. In addition, dopants are implanted through the opening 108 to form a region 802. The region 802 has the same type of majority carriers as the regions 601 and 602. The dopants for forming the region 802 may be implanted at various angles so that the region 802 reaches laterally beyond the region 601.

In the particular embodiment of FIG. 8A, the regions 601, 602, and 802 are n-type semiconductors. The combination of the regions 601, 602, and 802 may be referred to as the drift layer.

In some embodiments, phosphorus dopants are implanted into the semiconductor 102 having energy in the MeV range to form the region 601, and phosphorus or arsenic dopants are implanted into the semiconductor 102 to form the region 802 such that the region 802 is shallower than the region 601 and has a lower doping concentration. The combination of the region 601 and the region 800 provides a retrograde doping profile.

Figure 8B:
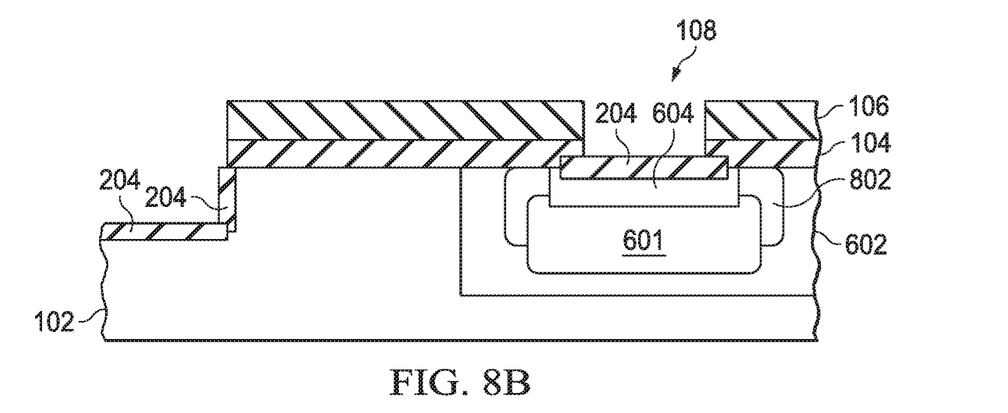
FIG. 8B shows an illustrative LDMOS at an initial stage of fabrication accordance with various examples.

FIG. 8B shows an LDMOS at a stage of fabrication according to an illustrative embodiment. The oxide layer 204 is thermally grown over the exposed portions of the surface of the semiconductor 102. This thermal growth further drives the regions 601 and 802 so that they spread as illustrated in FIG. 8B, and further drives the resurf region 604 so that it is in contact with the region 601 and the portion of the oxide layer 204 that is over the drift layer.

Figure 9:
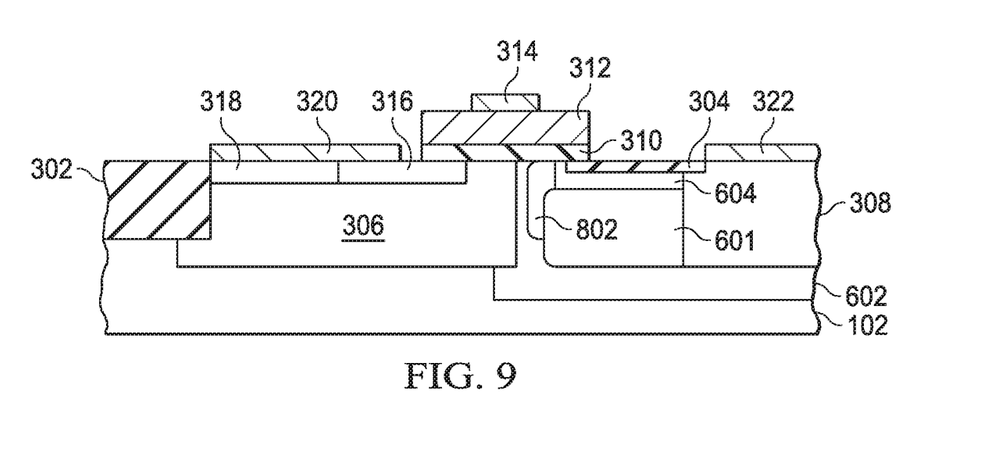
FIG. 9 shows an illustrative LDMOS at an initial stage of fabrication in accordance with various examples.

FIG. 9 shows an LDMOS at a stage of fabrication according to an illustrative embodiment. Additional processing steps applied to the embodiment of FIG. 8B result in the embodiment of FIG. 9. Silicon dioxide is deposited on the semiconductor 102, and the oxide layer 104 and the nitride layer 106 are stripped, followed by CMP. The drain region 308 is formed in the semiconductor 102 to contact the region 601 and the resurf region 604. The body region 306 is formed, and a gate 312 is formed over the gate oxide 310. The source region 316 and the body contact 318 are formed in the body region 306. The contact 314 is deposited on the gate 312, the contact 320 is deposited on the source region 316 and the body contact 318, and the contact 322 is deposited on the drain region 308.

The figures described above illustrate in simplified fashion a slice of an LDMOS at various stages of fabrication, where for ease of illustration the drawings are not drawn to scale. In practice, the semiconductor 102 is part of a wafer in which many devices may be fabricated. For ease of illustration, such other devices are not shown.

Figure 10:
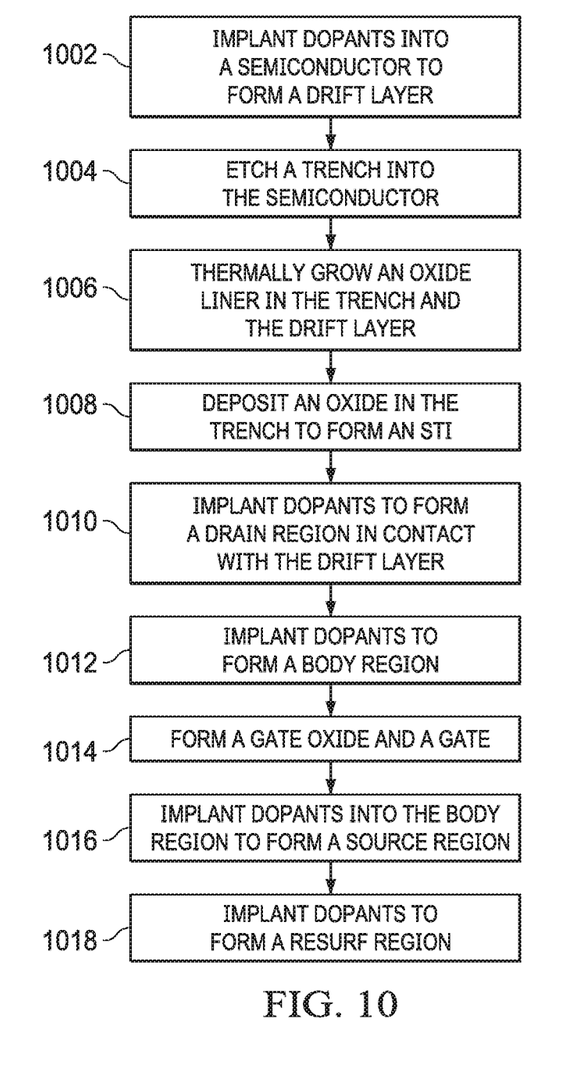
FIG. 10 shows an illustrative fabrication process in accordance with various examples.

FIG. 10 summarizes some of the process steps described previously. In step 1002, dopants are implanted into a semiconductor to form a drift layer having majority carriers of a first type. In the examples discussed, electrons are the majority carriers of the first type. In step 1004, a trench is etched into the semiconductor. In step 1006, an oxide (e.g., $SiO_2$) liner is thermally grown into and on the trench and the drift layer. In step 1008, an oxide (e.g., $SiO_2$) is deposited on the oxide liner on the trench to form an STI region.

In step 1010, dopants are implanted into the semiconductor to form a drain region in contact with the drift layer, where the drain region has majority carriers of the first type (e.g., electrons). In step 1012, dopants are implanted into the semiconductor to form a body region having majority carriers of a second type (e.g., holes). In step 1014, a gate oxide and a gate are formed over a portion of the drift layer and the body region. In step 1016, dopants are implanted into the body region to form a source region having majority carriers of the first type (e.g., electrons).

In step 1018, dopants are implanted into the semiconductor to form a resurf region having majority carriers of the second type (e.g., holes.). The step 1018 is optional for some embodiments.

For step 1002, the drift layer may be formed by implanting dopants to form two regions, where one region is shallower and of less dopant concentration than the other region. An example comprises the regions 601 and 802 as described with respect to the embodiment of FIG. 9.

The embodiments described above are directed to n-channel LDMOS transistors, where the source and drain regions are doped as n-type semiconductors, and the body region and resurf region are doped as p-type semiconductors. However, embodiments are not limited to n-channel LDMOS devices, but may also be directed to p-channel LDMOS devices. More generally, the source and drain regions may be described as semiconductors having majority carriers of a first type, and the body and resurf regions may be described as semiconductors having majority carriers of a second type. In the particular n-channel LDMOS embodiments described above, electrons are identified with the "first type" of majority carriers and holes are identified with the "second type" of majority carriers.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:
1. An integrated circuit having a transistor, comprising:
a semiconductor;

a drift layer within the semiconductor, the drift layer having a first conductivity type;

a shallow trench isolation region in the semiconductor laterally spaced apart from the drift layer, the shallow trench isolation region including a first portion of an oxide layer that lines the shallow trench isolation region and a fill oxide, wherein a second portion of the oxide layer overlies the drift layer, wherein a thickness of the second portion of the oxide layer is less than a thickness of the shallow trench isolation region;

and a smoothed surface that includes a top surfaces of the semiconductor, a top surface of the shallow trench isolation region and an entire top surface of the second portion of the oxide layer on the drift layer.

2. The integrated circuit of claim 1 further comprising:

a source region of the first conductivity type between the drift layer and the shallow trench isolation region;

a drain region of the first conductivity type adjacent the drift layer;

a region of a second opposite conductivity type between the drift layer and the source region; and a gate over the region of the second conductivity type.

3. The integrated circuit of claim 2, further comprising a doped region of the second conductivity type in the semiconductor between the drift layer and the second portion of the oxide layer.

4. The integrated circuit of claim 3, wherein the doped region is noncontiguous.

5. The integrated circuit of claim 3, wherein the doped region comprises indium.

6. The integrated circuit of claim 3, wherein the first conductivity type is n-type and the second conductivity type is p-type.

7. An integrated circuit having a transistor, comprising:

a semiconductor;

a drift layer within the semiconductor, the drift layer having a first conductivity type;

a shallow trench isolation region in the semiconductor laterally spaced apart from the drift layer, the shallow trench isolation region including a first portion of an oxide layer that lines the shallow trench isolation region and a fill oxide, wherein a second portion of the oxide layer overlies the drift layer, wherein a thickness of the second portion of the oxide layer is less than a thickness of the shallow trench isolation region;

a source region of the first conductivity type between the drift layer and the shallow trench isolation region;

a drain region of the first conductivity type adjacent the drift layer;

a first region of a second opposite conductivity type between the drift layer and the source region;

a gate over the first region of the second conductivity type; and a planar surface that includes top surfaces of the semiconductor, the drain region, the source region, the shallow trench isolation region and an entire top surface of the second portion of the oxide layer over the drift layer.

8. The integrated circuit of claim 7, further comprising a doped region of the second conductivity type in the semiconductor between the drift layer and the second portion of the oxide layer.

9. The integrated circuit of claim 8, wherein the doped region is noncontiguous.

10. The integrated circuit of claim 8, wherein the doped region comprises indium.

11. The integrated circuit of claim 7, wherein the first conductivity type is n-type and the second conductivity type is p-type.

* * * * *